United States Patent
Dabare et al.

(10) Patent No.: US 11,704,467 B2
(45) Date of Patent: Jul. 18, 2023

(54) AUTOMATED BALANCED GLOBAL CLOCK TREE SYNTHESIS IN MULTI LEVEL PHYSICAL HIERARCHY

(71) Applicant: Synopsys, Inc., Mountain View, CA (US)

(72) Inventors: Ashima Sahil Dabare, Noida (IN); Sanjiv Mathur, Noida (IN); Anusha Reddy Sindhwala, Bangalore (IN); Prakasha Karkada Holla, Bangalore (IN); Sivakumar Arulanantham, Hillsboro, OR (US); Srinivasan Krishnamurthy, Hillsboro, OR (US); Chun-Cheng Chi, Mountain View, CA (US); Shih-Pin Hung, Hsinchu (TW)

(73) Assignee: Synopsys, Inc., Sunnyvale, CA (US)

( * ) Notice: Subject to any disclaimer, the term of this patent is extended or adjusted under 35 U.S.C. 154(b) by 58 days.

(21) Appl. No.: 17/349,400

(22) Filed: Jun. 16, 2021

(65) Prior Publication Data
US 2021/0390242 A1  Dec. 16, 2021

(30) Foreign Application Priority Data
Jun. 16, 2020  (IN) .............................. 202041025226

(51) Int. Cl.
*G06F 30/396* (2020.01)
*G06F 30/398* (2020.01)
*G06F 30/394* (2020.01)

(52) U.S. Cl.
CPC .......... *G06F 30/396* (2020.01); *G06F 30/394* (2020.01); *G06F 30/398* (2020.01)

(58) Field of Classification Search
USPC ......................................................... 716/114
See application file for complete search history.

(56) References Cited

U.S. PATENT DOCUMENTS

| | | | |
|---|---|---|---|
| 2004/0060019 A1* | 3/2004 | Secatch | G06F 30/3312 716/113 |
| 2021/0165856 A1* | 6/2021 | Kazda | G06F 30/398 |
| 2021/0390242 A1* | 12/2021 | Dabare | G06F 30/398 |
| 2022/0300685 A1* | 9/2022 | Ludwig | G06F 30/23 |

\* cited by examiner

*Primary Examiner* — Mohammed Alam
(74) *Attorney, Agent, or Firm* — Weaver Austin Villeneuve & Sampson LLP (57) ABSTRACT

Embodiments provide for building a global clock tree. In embodiments, an example method includes inserting clock drivers at symmetric locations in one or more hierarchy levels of a plurality of hierarchy levels of an integrated circuit (IC) design. The example method further includes generating one or more routes by routing one or more nets within or across the one or more hierarchy levels of the plurality of hierarchy levels. The example method further includes matching symmetric routes of the one or more routes at each of the one or more hierarchy levels irrespective of a number of physical hierarchies each associated net spans. The example method further includes placing one or more ports at one or more signal entry points where routes of the one or more routes cross physical hierarchy blocks.

20 Claims, 8 Drawing Sheets

AUTOMATED BALANCED GLOBAL CLOCK TREE SYNTHESIS IN MULTI LEVEL PHYSICAL HIERARCHY

CROSS-REFERENCE TO RELATED APPLICATIONS

The present application claims priority to Indian Provisional Application No. 202041025226, titled "AUTOMATED BALANCED GLOBAL CLOCK TREE SYNTHESIS IN MULTI LEVEL PHYSICAL HIERARCHY," filed Jun. 16, 2020, the contents of which are incorporated herein by reference in their entirety.

TECHNICAL FIELD

The present disclosure generally relates to integrated circuit (IC) design, and more particularly, to automated balanced global clock tree synthesis in multi-level physical hierarchy.

BACKGROUND

As system on chips (SoCs) become more complex, the global clock tree spans an increasing number of physical blocks. Physical blocks themselves are complex which make it difficult to architect a clock tree spanning multiple physical hierarchies of these blocks. A global clock tree can be built within a physical hierarchy. To build a clock tree across physical hierarchies, a user must architect the global tree virtually and craft pieces for each block separately. Then each piece is implemented separately within the block.

SUMMARY

Embodiments herein provide for building a global clock tree. In embodiments, an example method includes inserting clock drivers at symmetric locations in one or more hierarchy levels of multiple hierarchy levels of an integrated circuit (IC) design. The example method may further include generating one or more routes by routing one or more nets within or across the one or more hierarchy levels of the multiple hierarchy levels. The example method may further include matching symmetric routes of the one or more routes at each of the one or more hierarchy levels irrespective of a number of physical hierarchies each associated net spans. The example method may further include placing one or more ports at one or more signal entry points where routes of the one or more routes cross physical hierarchy blocks.

In embodiments, matching symmetric routes includes adjusting wire length associated with one or more routes of the symmetric routes to ensure that a first wire length between first points of a first route of a first symmetric route matches a second wire length between second points of a second route of a second symmetric route. The first symmetric route and the second symmetric route may be symmetric in relation to one another. A clock driver may include one or more of a buffer or an inverter.

In embodiments, the method may further include receiving, via interaction signals provided by way of user input via a computing device, a number of clock drivers to be inserted into each hierarchy level of the integrated circuit (IC) design.

In embodiments, the method may further include providing top level visibility into block level routing blockages. The method may further include performing top level routing such that, during pushdown of routes, design rule checks (DRCs) are clean inside each hierarchy level of the multiple hierarchy levels. Providing top level visibility into block level routing blockages may include providing visibility into block level routing blockages at a top level perspective during routing.

In embodiments, the method may further include creating uniblock blockage along a hierarchy block boundary to prevent routing along the hierarchy block boundary. Creating uniblock blockage may include inserting a uniblock structure. A uniblock structure enforces routing in one specific direction.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DISCLOSURE

Aspects of the present disclosure related to automated balanced global clock tree synthesis in a multi-level physical hierarchy.

Figure 1:
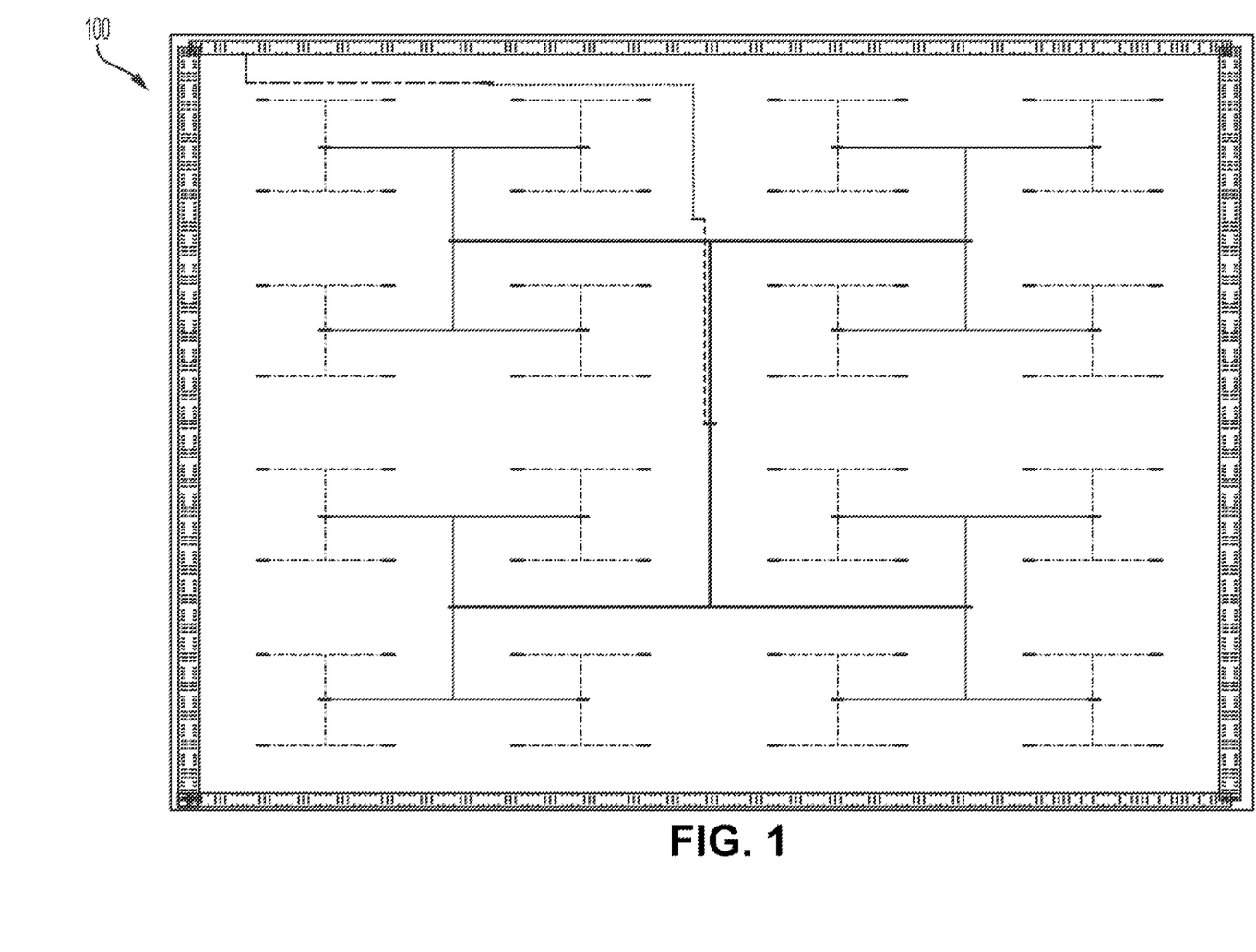
FIG. 1 illustrates an example global clock tree, according to embodiments of the present disclosure.

The speed of a system on an integrated circuit (IC) chip is largely determined by system clock frequency. In a synchronous IC chip, a clock distribution network (referred to as a "clock-tree") is used to distribute a clock signal from a common source to various circuit components. This clock signal is used to coordinate data transfers between circuit components. However, as increasing clock frequencies reduce the clock periods to fractions of a nanosecond, designing clock-trees is becoming increasingly more challenging. To manage this challenge, clock trees are often built in two phases—global clock tree and local clock tree. A global clock tree spans a larger area and thus requires tighter structure to contain delay of the clock and skew between various regions the clock is distributed to. An example of a global clock tree 100 is shown in FIG. 1.

With complex systems being built using integrated circuits, the physical design of the chip may contain multiple smaller blocks of circuits. A global clock distribution must reach these multiple physical blocks seamlessly. Thus, the global clock distribution must cross and/or terminate multiple physical blocks to build a required clock structure. It becomes challenging to build a balanced global clock tree structure spanning multiple physical boundaries.

Typically, global clock tree distribution is done using Electronic Design Automation (EDA) software tools. The present disclosure presents a technique to build global clock trees across multiple physical hierarchies automatically in an EDA tool. Prior to the present disclosure, global trees for physical hierarchies were hand-designed for each physical hierarchy and must be stitched together manually.

Conventionally, there is lacking a mechanism to create and route a clock tree with balanced (each level) and symmetric tree from the top level. Thus, the user creates the buffer tree along with stand-alone custom routing to create a balanced tree, then the balanced tree is pushed down to the block. This also results in sub-optimal quality of result (QoR). Moreover, the pushed down structure may face routing blockages and would require manual fixing or re-doing the entire flow again.

The aforementioned limitations are eliminated with embodiments herein. Embodiments herein reduce computing time and resources required to plan a multi-level hierarchical clock tree with all the logical and physical connections. Embodiments herein automate and optimize the process of building a global clock tree and allow a user to build the clock tree globally without worrying about physical (e.g., blocks) hierarchies that the global clock tree spans.

With embodiments herein, the global clock tree can be planned and implemented together rather than splitting at a top level and block level(s) and optimizing separately. This results in better skew and latency due to balancing and optimization of the global clock tree together.

For high speed designs, clock on-chip variation is minimized from the top level to block clock distribution by having a very symmetric tree. With embodiments herein, the user preferably is not required to go back and forth between a top level and block levels when constructing the top level clock distribution tree because the present embodiments provide for full hierarchy awareness.

Figure 2:
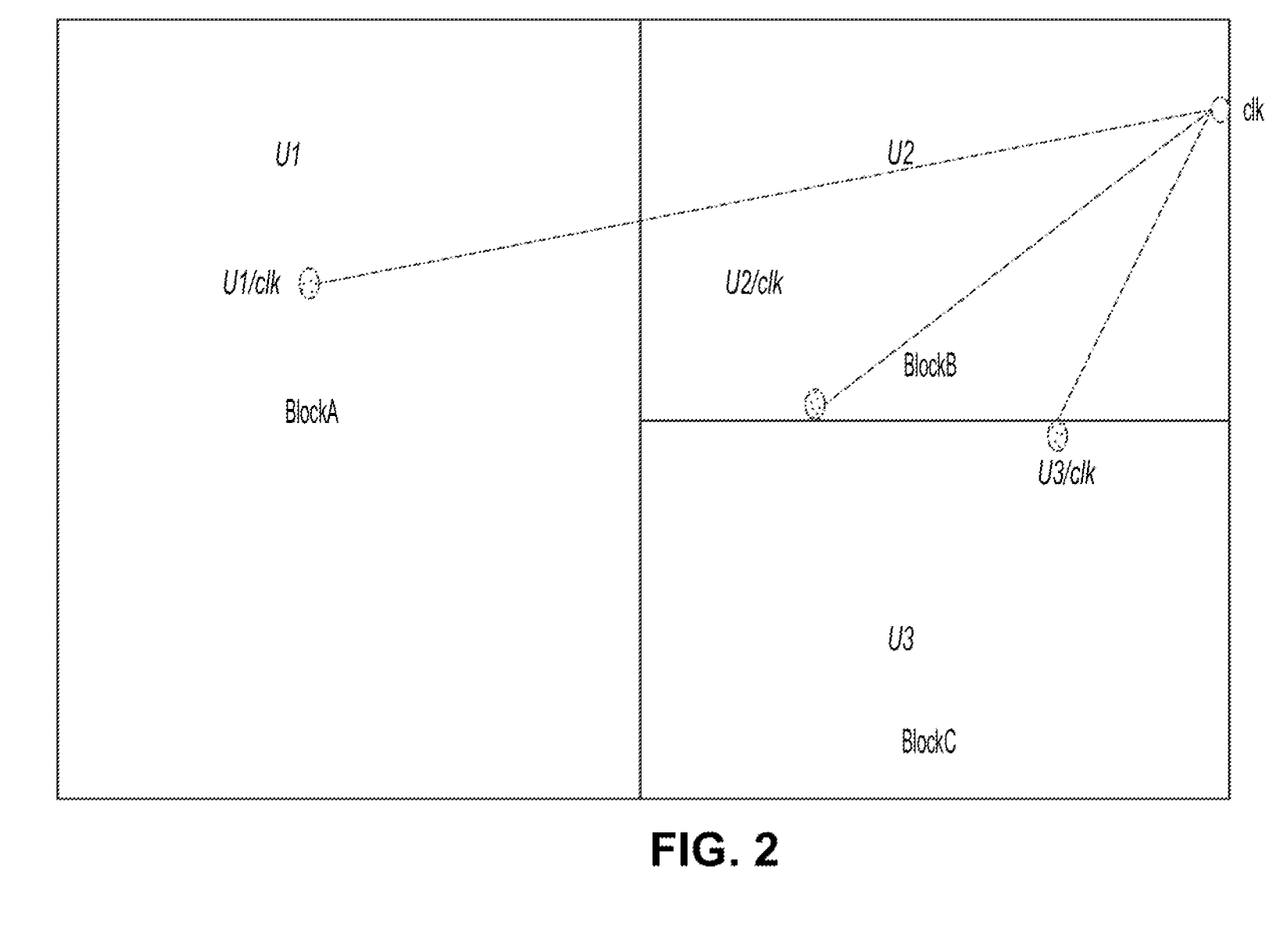
FIG. 2 illustrates an example multi-level physical hierarchy design style where physical hierarchies contain parent level (top) blocks and child level (blocks), according to embodiments of the present disclosure.
Figure 3:
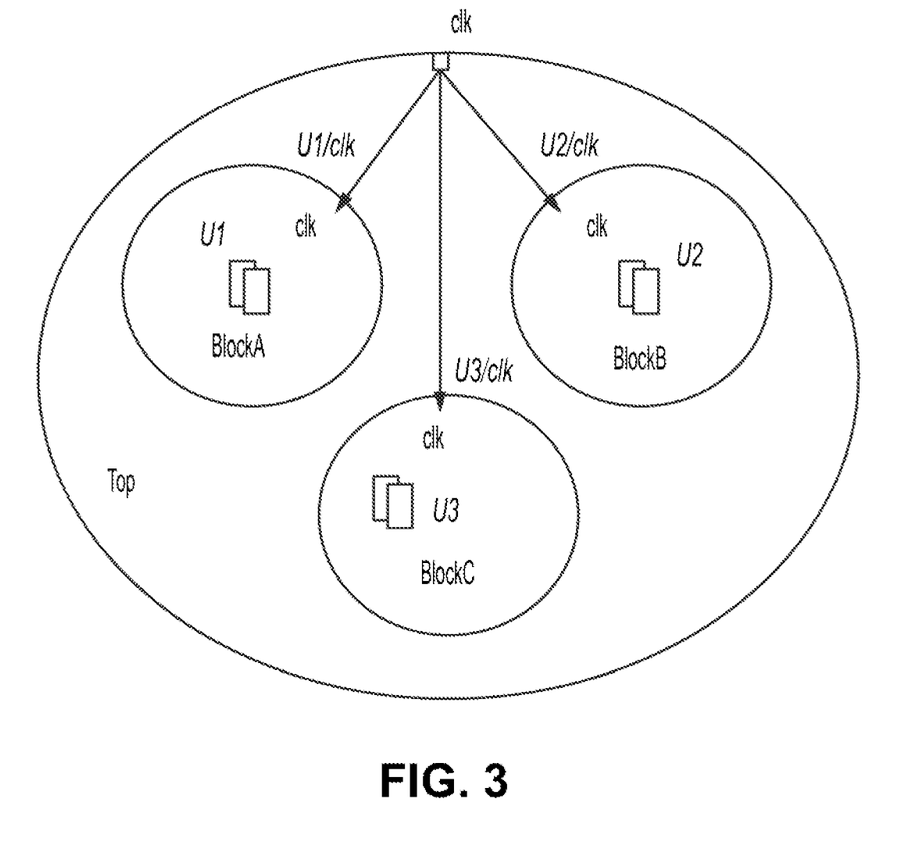
FIG. 3 illustrates a logical hierarchy equivalent of the physical hierarchy depicted in FIG. 2, according to embodiments of the present disclosure.

A complex multi-million instance chip implementation requires a multi-level physical hierarchy design style where physical hierarchies contain parent level (top) blocks and child level (blocks), as shown in FIG. 2. FIG. 2 is the physical hierarchy equivalent of the logical hierarchy depicted in FIG. 3.

Chip implementation uses many physical hierarchies to do a divide and conquer approach, which essentially means, instead of one user working on a large SoC design implementation, the chip is broken into many parts and many users implement their own block.

In the fully abutted multi-level physical hierarchical design, there is no placeable area at the top (parent) level, thus implementing a clock distribution H-tree (with minimal skew requirement) is more complicated. An H-tree is a fractal tree structure constructed from perpendicular line segments, each smaller by a factor of the square root of 2 from the next larger adjacent segment. The H-tree may be used as a clock distribution network for routing timing signals to all parts of a chip with equal propagation delays to each part.

This implementation requires significant amounts of manual resources as well as user guidance to compete with the existing EDA tool features/technologies. In an abutted design, the user is unable to do a top down flow as there is no placeable area at the top (parent) level. These challenges apply to non-abutted designs as well since most of the part of H-Tree falls on various physical blocks.

Conventional automated clock tree simulation solutions only work on single level physical hierarchy designs or limited channel based multi-level physical hierarchical designs. Conventional automated clock tree simulation solutions are unable to create the logical/physical hierarchy pins for the nets that cross physical boundaries to establish new connection based on top level buffer tree. In a design with multiple physical blocks, conventional solutions are unable to perform a top down flow because there is limited placeable area at top (parent) level. Moreover, conventional solutions lack a mechanism to model/implement every net segment with balanced delay. One reason for this is that some nets or segments of those nets would be in various physical blocks and cannot be analyzed together at a single level (e.g., top level).

Finally, conventional solutions cannot always build a buffer tree with exact clock depth which causes common path sharing and/or on-chip variation issues for the top level clock network.

Embodiments herein provide for global clock tree building involving a series of operations. In an example first step, clock drivers are inserted which involves insertion of repeaters (e.g., buffers or inverters) to provide the right topology to clock tree. These repeaters or clock drivers may be inserted at different hierarchy levels based on locations suitable for H-tree construction. It will be appreciated that a repeater can be any type of standard cell selected by a user.

An example subsequent step involves synthesizing routes across physical hierarchies considering obstructions to connect the clock drivers. These routes are synthesized to minimize physical hierarchy boundary crossings and match route length across segments. The routes which cross physical hierarchy blocks require corresponding physical ports to be created at those points as signal entry points.

Figure 4:
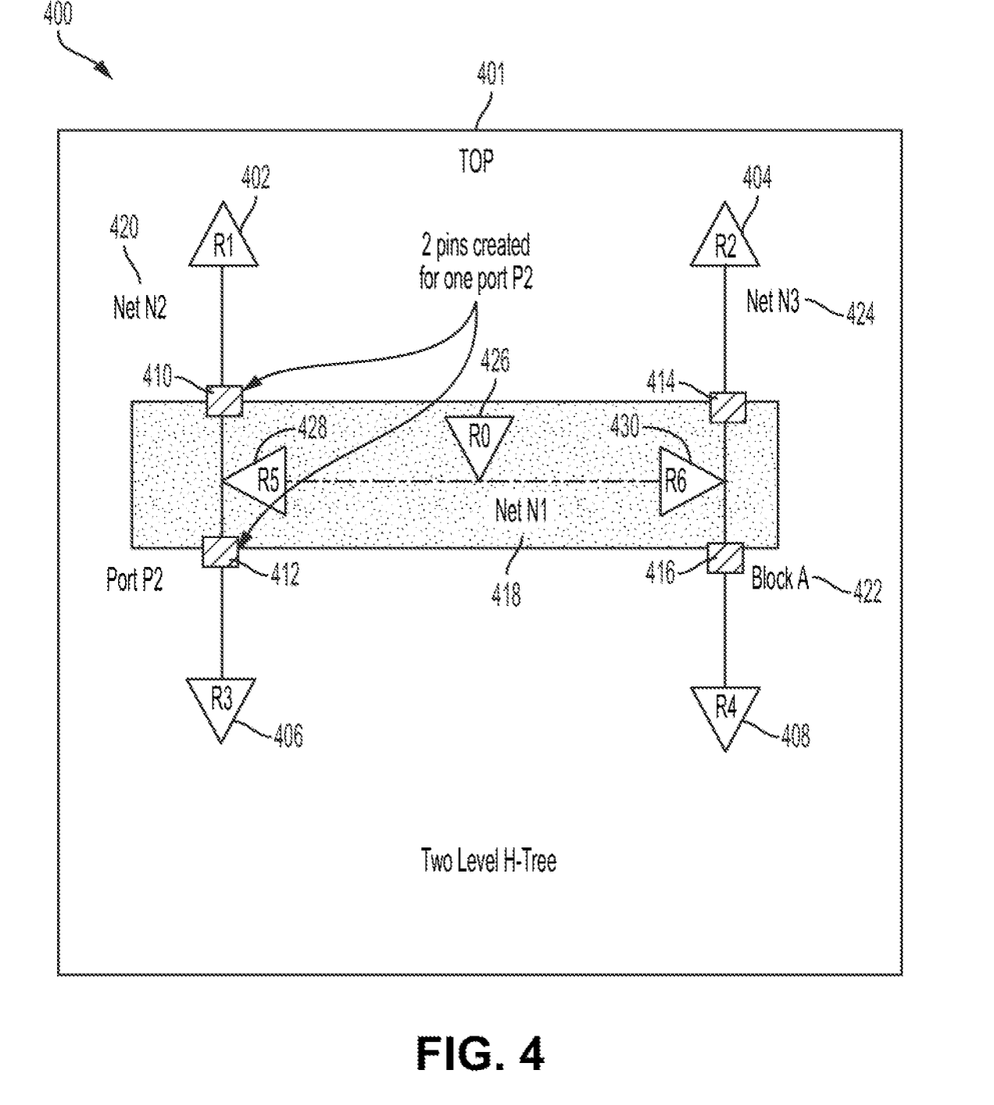
FIG. 4 illustrates an example routed tree with two levels of physical hierarchy, according to embodiments of the present disclosure.

Depiction of such routed tree with two levels of physical hierarchy 400 is shown in FIG. 4. In FIG. 4, there is a physical hierarchy block "A" 422 inside the top block "TOP" 401 To build an H-tree structure, repeaters R0 426, R1 402, R2 404, R3 406, R4 408, R5 428, and R6 430 are inserted at symmetric locations (e.g., in relation to one another) as shown in FIG. 4. The repeaters R0 426, R5 428, and R6 430 are inserted inside block A 422 while R1 402, R2 404, R3 406, and R4 408 are inserted at top level 401. The net N1 418 is completely routed inside block A 422. The nets N2 420 and N3 424 overlap with block A 422 as well as the TOP block 401. Hence, the routing of these nets spans across block A 422 and TOP block 401.

The repeater locations can fall on different physical hierarchies. Repeater insertion is performed across physical hierarchies while updating logical connectivity as required. Load distribution across physical hierarchies is also resolved herein. The UPF and power constraints are confirmed, enforced, or met, and appropriate repeaters are automatically selected for each power domain.

Routing happens in conjunction with repeater insertion. Repeaters define the levels in H Tree. At each level balanced routing is done to achieve equal delay at all levels (e.g., balanced routing may refer to matching lengths of wires for symmetric routes). Routing is done with awareness of physical hierarchy boundaries and constraints therein. Care is taken to avoid routing along physical boundaries and minimize physical boundary crossings. Physical pins are created where routes are crossing physical boundary. The router manages corner scenarios like feedthrough blocks, etc.

Embodiments herein enable a user to insert clock drivers in a symmetric manner inside different physical hierarchy blocks in a single operation or set of operations. The user can provide the number of repeaters/buffers to be inserted. Based at least in part on this input, the location and hierarchy for each repeater is inferred automatically such that a multi-level global H-tree structure can be created. The user can also provide guidance to build any other symmetric structure apart from H-tree.

Figure 5:
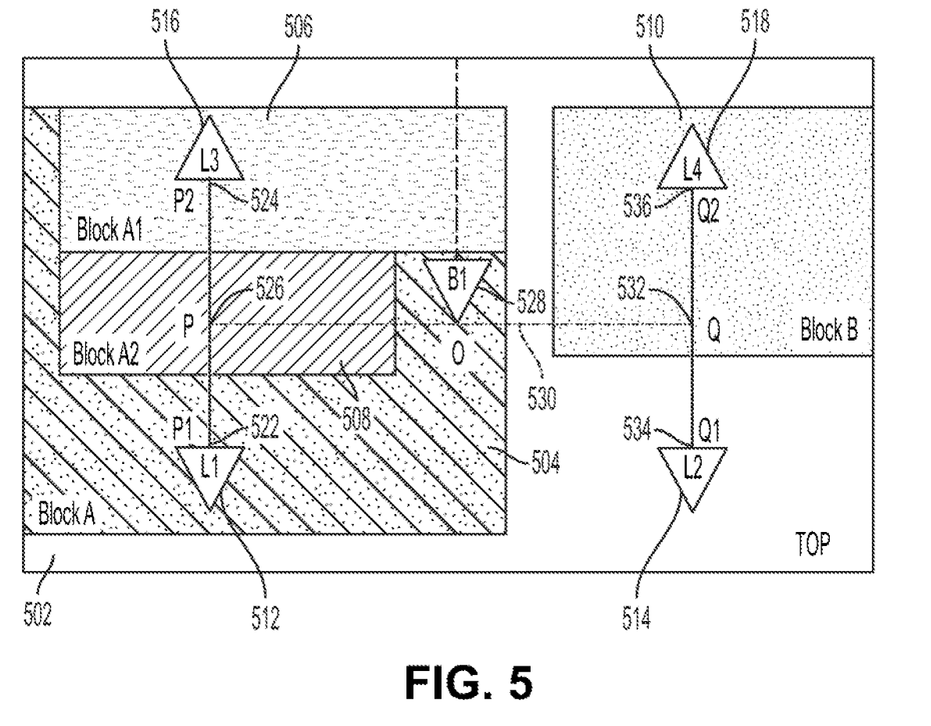
FIG. 5 illustrates an example design "TOP" with multiple physical hierarchy blocks, according to embodiments of the present disclosure.

Consider a design "TOP" level block 502 with multiple physical hierarchy blocks as shown in FIG. 5. In the event that a two-level H-tree structure needs to be built, embodiments herein automatically infer locations to assign to repeaters B1 528, L1 512, L2 514, L3 516 and L4 518 based on clock tree sinks, as well as the H-tree structure required and the floorplan of the design.

The physical hierarchy block to be used for insertion of each buffer is identified based on a location of the buffer. The block identified for insertion may be present at any level of physical hierarchy in the design. For example, buffer L3 516 is inserted in physical block A1 506 which is present inside another block A 504 in the top design 502.

Once all of the buffers are inserted in corresponding physical hierarchies, embodiments herein define an H-tree topology by using the buffer location points O 530, P1 522, P2 524, Q1 534, and Q2 536, and automatically identifying intermediate points P 526 (e.g., in block A2 508) and Q 532 (e.g., in block B 510). H-tree routing is done at top level 502 and is aligned with the topology identified based on H-tree structure. Thus the route segment connecting point O 530 to point P2 524 passes through an intermediate point P 526 residing in a different physical hierarchy.

Embodiments herein provide for all routing except connection to pins (explained later) to be performed at the top level only. Top level routing having large trunks of route shapes as they may be called, is typically done at the top 2 routing layers. Conventional technology to enable this involve performing a virtually flat routing by understanding routing blockages of the top layers of each block at top level and creating routes which are realizable inside the blocks seamlessly. With the routing blockages visible at the top level, according to embodiments herein, the router is able to create trunk routes and also balance lengths. This ensures that when route shapes of these trunks are pushed down, no DRC is introduced and clean routes become available in block.

Figure 6:
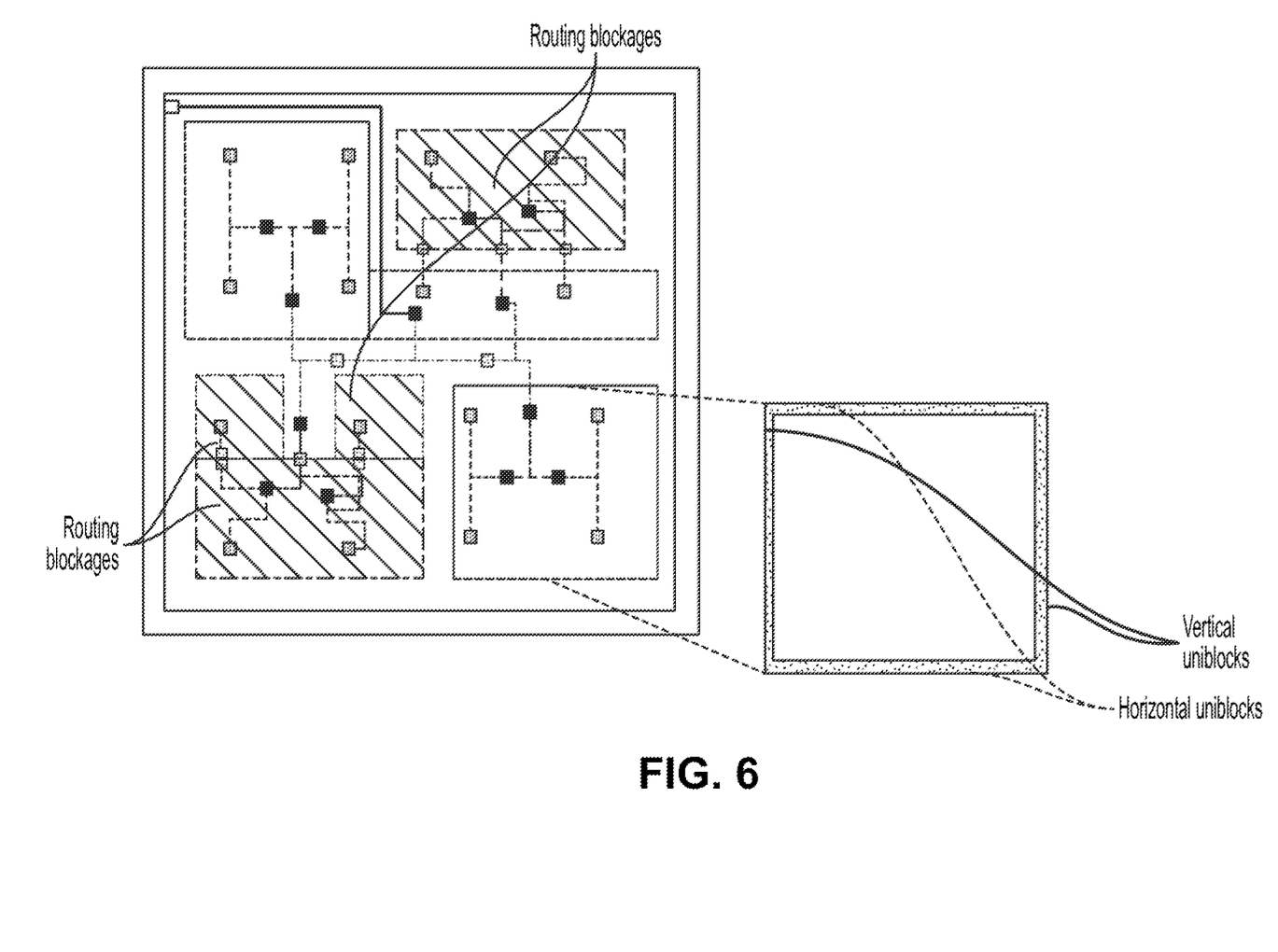
FIG. 6 illustrates example uniblock blockage created along a block boundary created by routing herein to prevent routing along the block boundary, according to embodiments of the present disclosure.

Referring to FIG. 6, routing described herein may also create uniblock blockage along the block boundary to prevent routing along a block boundary. A uniblock is a structure in a router which only allows routing in one specific direction within the uniblock area.

If there are detours due to routing congestion, the length of route segments at each level is matched to minimize the skew in the clock tree. For example, with reference to FIG. 5, after balancing routes, the route segments OP (e.g., from point O 530 to point P 526) and OQ (e.g., from point O 530 to point Q 532) would have equal length and route segments P-P1 (e.g., from point P 526 to point P1 522), P-P2 (e.g., from point P 526 to point P2 524), Q-Q1 (e.g., from point Q 532 to point Q1 534), and Q-Q2 (e.g., from point Q 532 to point Q2 536) would all have the same length. That is, balancing segments herein refers to ensuring that symmetric route segments (e.g., route segments OP and OQ; e.g., route segments P-P1, P-P2, Q-Q1, and Q-Q2) have matching or equal length. Ensuring the route segments have equal length may involve adjusting by increasing or decreasing wire length between route points of the route segments.

Once the routing is complete at top level, the route shapes overlapping with a physical block are pushed inside that block and physical pin shapes are created at block boundaries to complete the connection. The pin shapes are created at block boundary at the location where the route crosses the block at top level. The pin shape may also fall on the layer where the route shape was created. The routing to buffer pins is also completed inside the physical hierarchies. This is to build connection from route shape pushed down from top level to the pin of the buffer(s) in the block.

A symmetric global H-tree structure spanning over multiple physical hierarchies can be obtained in this manner where different buffers as well as the routes connecting those buffers reside inside different physical hierarchies. This flow is completely automatic where the only input needed from user is the number of levels desired in the H-tree structure and buffer locations/configuration at top level.

Figure 7:
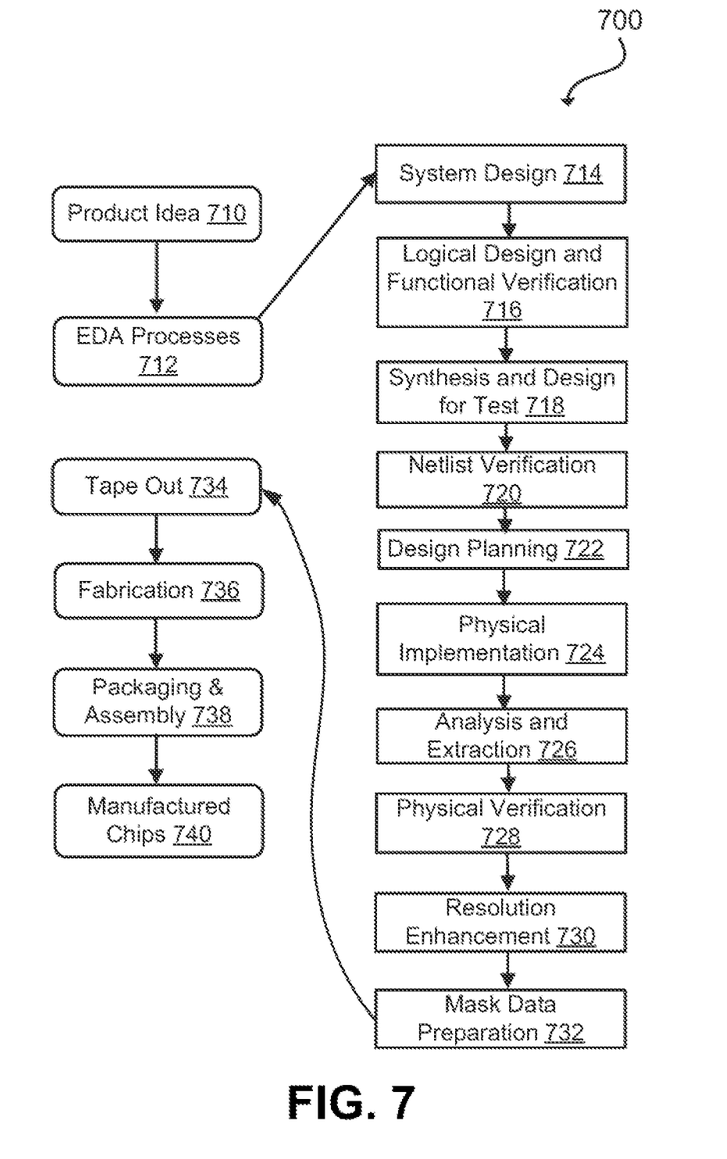
FIG. 7 depicts a flowchart of various operations performed during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 8) may be used to store the programs and data structures that are used by some or all of the EDA products described herein, and products used for development of cells for the library and for physical and logical design that use the library.

Figure 8:
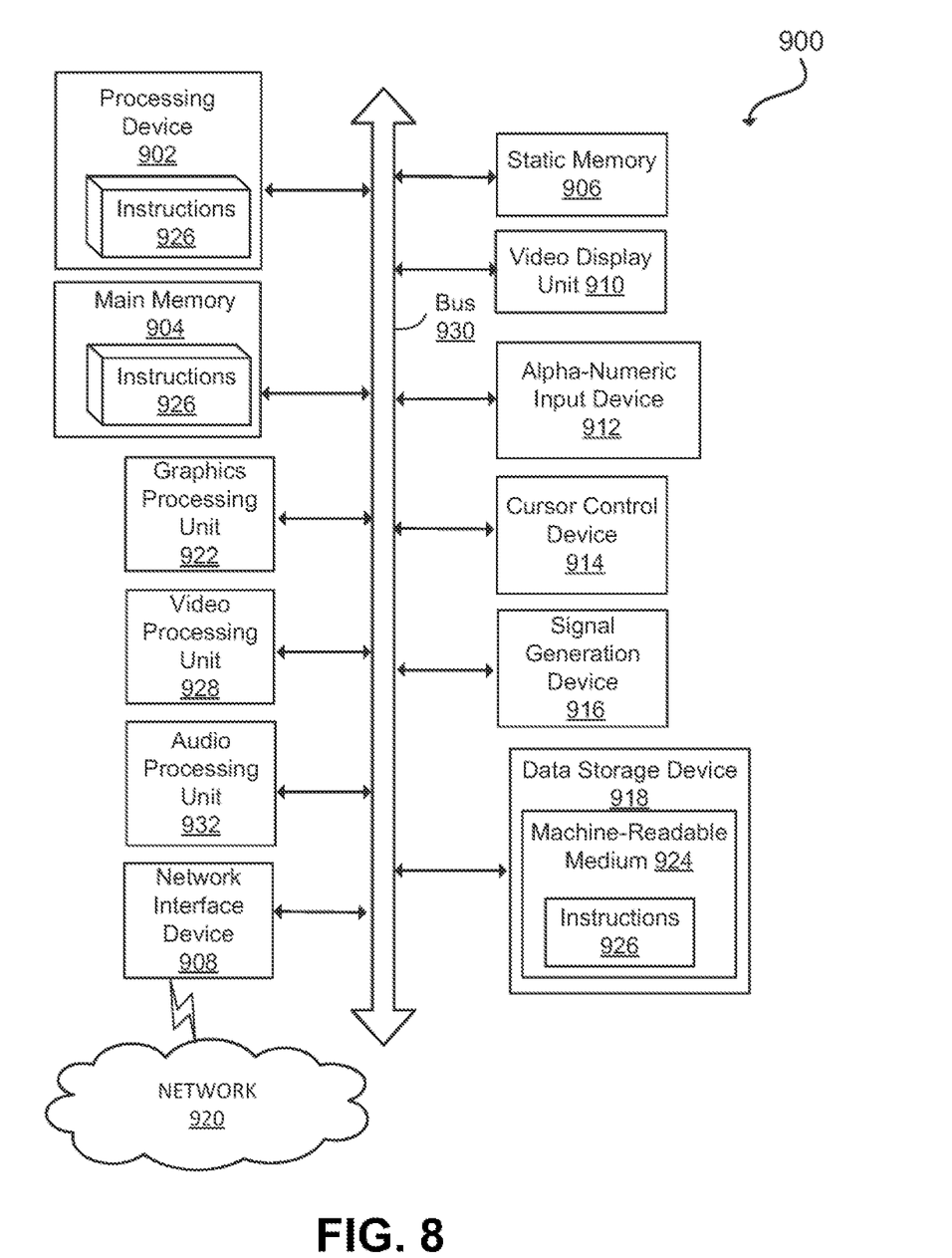
FIG. 8 depicts an example diagram of an example computer system in which embodiments of the present disclosure may operate.

FIG. 8 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for building a global clock tree, comprising:
    inserting a plurality of clock drivers at symmetric locations in one or more hierarchy levels of a plurality of hierarchy levels of an integrated circuit (IC) design;
    generating one or more routes between the plurality of clock drivers by routing one or more nets to one or more of within across the one or more hierarchy levels of the plurality of hierarchy levels;
    matching symmetric routes of the one or more routes at each of the one or more hierarchy levels; and
    placing one or more ports at one or more signal entry points where routes of the one or more routes across physical hierarchy blocks.

2. The method of claim 1, wherein matching symmetric routes comprises adjusting wire length associated with one or more routes of the symmetric routes to ensure that a first wire length between first points of a first route of a first symmetric route matches a second wire length between second points of a second route of a second symmetric route.

3. The method of claim 2, wherein the first symmetric route and the second symmetric route are symmetric in relation to one another.

4. The method of claim 1, wherein a first one the plurality of clock drivers comprises one or more of a buffer or an inverter.

5. The method of claim 1, further comprising:
    receiving, via interaction signals provided by way of user input via a computing device, the plurality of clock drivers to be inserted into each hierarchy level of the integrated circuit (IC) design.

6. The method of claim 1, further comprising:
    providing top level visibility into block level routing blockages; and
    performing top level routing such that, during pushdown of routes, design rule checks (DRCs) are clean inside each hierarchy level of the plurality of hierarchy levels.

7. The method of claim 6, wherein providing top level visibility into block level routing blockages comprises providing visibility into block level routing blockages at a top level perspective during routing.

8. The method of claim 1, further comprising:
creating uniblock blockage along a hierarchy block boundary to prevent routing along the hierarchy block boundary.

9. The method of claim 8, wherein creating uniblock blockage comprises inserting a uniblock structure.

10. The method of claim 9, wherein a uniblock structure enforces routing in one specific direction.

11. A computer-readable medium, comprising at least one non-transitory computer storage medium for storing instructions that, when executed by an apparatus, cause the apparatus to:
insert a plurality of clock drivers at symmetric locations in one or more hierarchy levels of a plurality of hierarchy levels of an integrated circuit (IC) design;
generate one or more routes between the plurality of clock drivers by routing one or more nets to one or more of within across the one or more hierarchy levels of the plurality of hierarchy levels;
match symmetric routes of the one or more routes at each of the one or more hierarchy levels; and
place one or more ports at one or more signal entry points where routes of the one or more routes across physical hierarchy blocks.

12. The computer-readable medium of claim 11, wherein matching symmetric routes comprises adjusting wire length associated with one or more routes of the symmetric routes to ensure that a first wire length between first points of a first route of a first symmetric route matches a second wire length between second points of a second route of a second symmetric route.

13. The computer-readable medium of claim 12, wherein the first symmetric route and the second symmetric route are symmetric in relation to one another.

14. The computer-readable medium of claim 11, wherein the at least one non-transitory computer storage medium stores instructions that, when executed by an apparatus, further cause the apparatus to:
receive, via interaction signals provided by way of user input via a computing device the plurality of clock drivers to be inserted into each hierarchy level of the integrated circuit (IC) design.

15. The computer-readable medium of claim 11, wherein the at least one non-transitory computer storage medium stores instructions that, when executed by an apparatus, further cause the apparatus to:
provide top level visibility into block level routing blockages; and
perform top level routing such that, during pushdown of routes, design rule checks (DRCs) are clean inside each hierarchy level of the plurality of hierarchy levels.

16. The computer-readable medium of claim 15, wherein providing top level visibility into block level routing blockages comprises providing visibility into block level routing blockages at a top level perspective during routing.

17. The computer-readable medium of claim 11, wherein the at least one non-transitory computer storage medium stores instructions that, when executed by an apparatus, further cause the apparatus to:
create uniblock blockage along a hierarchy block boundary to prevent routing along the hierarchy block boundary.

18. The computer-readable medium of claim 17, wherein creating uniblock blockage comprises inserting a uniblock structure.

19. The computer-readable medium of claim 18, wherein a uniblock structure enforces routing in one specific direction.

20. An apparatus comprising at least one processor and at least one memory storing instructions that, when executed by the processor, cause the apparatus to:
insert a plurality of clock drivers at symmetric locations in one or more hierarchy levels of a plurality of hierarchy levels of an integrated circuit (IC) design;
generate one or more routes between the plurality of clock drivers by routing one or more nets to one or more of within across the one or more hierarchy levels of the plurality of hierarchy levels;
match symmetric routes of the one or more routes at each of the one or more hierarchy levels; and
place one or more ports at one or more signal entry points where routes of the one or more routes across physical hierarchy blocks.

* * * * *